United States Patent
Okada et al.

(10) Patent No.: US 9,172,024 B2
(45) Date of Patent: Oct. 27, 2015

(54) ULTRASOUND PROBE AND METHOD OF MANUFACTURING ULTRASOUND PROBE

(71) Applicants: Kabushiki Kaisha Toshiba, Tokyo (JP); Toshiba Medical Systems Corporation, Otawara-shi (JP)

(72) Inventors: Kengo Okada, Nasushiobara (JP); Hiroyuki Shikata, Nasushiobara (JP); Minoru Aoki, Yaita (JP); Satoru Tezuka, Nasushiobara (JP); Yasuhisa Makita, Nasushiobara (JP)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 372 days.

(21) Appl. No.: 13/795,103

(22) Filed: Mar. 12, 2013

(65) Prior Publication Data
US 2013/0241355 A1    Sep. 19, 2013

(30) Foreign Application Priority Data
Mar. 13, 2012 (JP) .................................. 2012-055236

(51) Int. Cl.
*H01L 41/25* (2013.01)
*H01L 41/08* (2006.01)
*B06B 1/06* (2006.01)

(52) U.S. Cl.
CPC .......... *H01L 41/0825* (2013.01); *B06B 1/0622* (2013.01); *H01L 41/25* (2013.01); *Y10T 29/42* (2015.01)

(58) Field of Classification Search
CPC ..... G01N 29/28; G10K 11/004; G10K 11/02; B06B 1/0622
USPC .......................................... 310/334, 335, 336
See application file for complete search history.

(56) References Cited

U.S. PATENT DOCUMENTS 7,288,069 B2 * 10/2007 Takeuchi et al. ............... 600/459
7,808,157 B2 * 10/2010 Oakley et al. .................. 310/334
(Continued)

FOREIGN PATENT DOCUMENTS

| CN | 1874615 A | 12/2006 |
|---|---|---|
| JP | 3181949 | 4/2001 |

(Continued)

OTHER PUBLICATIONS

Combined Chinese Office Action and Search Report issued Sep. 3, 2014 in Patent Application No. 201310079137.6 (with English translation of categories of cited documents).

*Primary Examiner* — Derek Rosenau
*Assistant Examiner* — Bryan Gordon
(74) *Attorney, Agent, or Firm* — Oblon, McClelland, Maier & Neustadt, L.L.P.

(57) ABSTRACT

A backing material is provided on the back face side of a piezoelectric transducer, with a first width substantially equal to the piezoelectric transducer widthwise and perpendicular to the radiation direction. A front face of a layer located on the front face side with regard to a wiring pattern has a width substantially equal to the first width. Moreover, the back face of this layer has a second width shorter than the first width. A space is provided between this layer and the backing material due to the difference between the first width and the second width of this layer, and a covering member covering the wiring pattern covers the wiring pattern extending at least from the folded section of the flexible substrate into the space.

12 Claims, 8 Drawing Sheets

(56) References Cited

U.S. PATENT DOCUMENTS

| | | | |
|---|---|---|---|
| 2009/0034370 A1* | 2/2009 | Guo | 367/180 |
| 2010/0066207 A1* | 3/2010 | Saito | 310/335 |
| 2010/0176688 A1* | 7/2010 | Jin et al. | 310/327 |
| 2010/0187952 A1* | 7/2010 | Fukase et al. | 310/336 |
| 2011/0121687 A1* | 5/2011 | Aoki | 310/334 |
| 2011/0133604 A1* | 6/2011 | Min et al. | 310/336 |
| 2011/0181149 A1 | 7/2011 | Shikata | |
| 2011/0316389 A1* | 12/2011 | Kwon et al. | 310/335 |
| 2012/0056512 A1* | 3/2012 | Jin et al. | 310/335 |

FOREIGN PATENT DOCUMENTS

| | | |
|---|---|---|
| JP | 2011-152303 | 8/2011 |
| JP | 4941998 | 3/2012 |

* cited by examiner

ULTRASOUND PROBE AND METHOD OF MANUFACTURING ULTRASOUND PROBE

CROSS-REFERENCE TO RELATED APPLICATION

This application is based upon and claims the benefit of priority from Japanese Patent Application No. 2012-055236, filed Mar. 13, 2012; the entire contents of which are incorporated herein by reference.

FIELD

The embodiments of the present invention relates to an ultrasound probe and a method of manufacturing an ultrasound probe.

BACKGROUND

An ultrasound imaging apparatus obtains biological information by scanning a subject through an ultrasound probe. Moreover, the ultrasound imaging apparatus images the state within the subject based on the obtained biological information. That is, the ultrasound imaging apparatus sends a control signal regarding the scanning of the ultrasound waves to the ultrasound probe. Based on the control signal, ultrasound waves are sent to the subject through the ultrasound probe. In addition, the ultrasound probe receives reflected waves from the subject. Based on these reflected waves, the ultrasound imaging apparatus acquires biological information based on the state within the subject. Moreover, the ultrasound imaging apparatus creates an ultrasound image based on this biological information.

An ultrasound probe has, for example, the following configuration. The ultrasound probe comprises a piezoelectric transducer group with a 1-dimensional array or 2-dimensional array. On the side facing the radiation direction (acoustic radiation direction) of the ultrasound waves in said piezoelectric transducer group (hereinafter referred to as the "front face side"), an acoustic matching layer is placed with an electrode in between. The acoustic matching layer is placed for the purpose of matching the acoustic impedance of the piezoelectric transducer and the acoustic impedance of a biological object. On the side facing the direction opposite the radiation direction of the ultrasound waves in the piezoelectric transducer (hereinafter referred to as the "back face side"), a backing material is placed with an electrode and FPC (Flexible Printed Circuit) in between. Moreover, an intermediate layer with electric conductivity may be placed between the piezoelectric transducer and the backing material.

The ultrasound waves irradiated to the back face side of the piezoelectric transducer are attenuated and absorbed by the backing material. In addition, the structure of, for example, the piezoelectric transducer is supported by the backing material. The intermediate layer has higher acoustic impedance than the piezoelectric transducer, and is provided to enhance the radiation efficiency of the ultrasound waves. Due to the gap between the acoustic impedance of the intermediate layer and the acoustic impedance of the piezoelectric transducer, the ultrasound waves irradiated to the back face side of the piezoelectric transducer are reflected by these interfaces. Therefore, the ultrasound waves are sent out to the ultrasound wave radiation plane side that is the front face of the piezoelectric transducer. In addition, a wiring pattern (electrode lead) is provided on the piezoelectric transducer side of the FPC. Through the wiring pattern of the FPC, an electric signal is sent from the subsequent circuit to the piezoelectric transducer. Moreover, through the wiring pattern of the FPC, an electric signal is drawn from the piezoelectric transducer to the subsequent circuit.

As described above, the FPC is placed on the front face side in the backing material. This FPC is, for example, placed substantially parallel to the backing material so as to cover the front face side of the backing material. However, the FPC is folded toward the subsequent circuit side (the side opposite the piezoelectric transducer) at the end of the front face of the backing material, and extended toward the subsequent circuit side. If the FPC is not folded toward the subsequent circuit side at the end of the front face of the backing material, the FPC spreads in the array direction or lens direction in the ultrasound transducer. By preventing the FPC from spreading, the ultrasound probe is prevented from becoming larger. In addition, folding the FPC at the end of the front face of the backing material is also for the purpose of improving the impact resistance.

Moreover, the FPC and the construct (the piezoelectric transducer or the intermediate layer) are adhered to each other using an adhesive in order to improve the reliability of the connection. This construct may hereinafter be referred to as the "intermediate layer, etc." For example, the side (the surface substantially parallel to the radiation direction of the ultrasound waves) of each intermediate layer, etc., in a 1D alignment or 2D alignment and the front face of the FPC are adhered (see, for example, Patent Document 1/FIG. 2, reference 140). That is, there is no adhesive layer on the plane in which each intermediate layer, etc., is facing the FPC. With such a configuration, the adhesive layer is provided in the position at which the intermediate layer, etc., on further end of the element alignment is adjacent to the front face of the FPC. That is, one interface to be bonded with the adhesive is the end of the side of the intermediate layer, etc., while the other interface is the face of the FPC facing the radiation direction of the ultrasound waves.

However, the above-mentioned FPC has a risk of breakage due to being folded. Consequently, there is a risk of breakage (such as disconnection) of the wiring pattern in the FPC. Moreover, in the process of manufacturing the ultrasound transducer, even when carrying out the procedure of firstly adhering the FPC and the intermediate layer (or the piezoelectric transducer) and then folding the FPC, there is a risk of breakage of the wiring pattern. That is, when trying to fold the FPC after the adhesive has set to some extent, the wiring pattern is folded in the state bonded to the adhesive that has been set. Consequently, a force may be applied to the wiring pattern in the direction of resistance to the bonded state by the adhesive to cause a breakage.

In order to prevent such a breakage of the wiring pattern at the folded section of the FPC, a coverlay (film, covering material) using, for example, a polyimide film may be provided on said folded section. This coverlay protects the wiring pattern.

DETAILED DESCRIPTION

The ultrasound probe according to this embodiment comprises a piezoelectric transducer, a backing material, and a flexible substrate. The piezoelectric transducer has electrodes on each of a front face facing the radiation direction of ultrasound waves and a back face facing the opposite direction. The backing material is provided on the back face side of the piezoelectric transducer, and has a first width substantially equal to the width of the piezoelectric transducer widthwise and perpendicular to the radiation direction of the ultrasound waves. The flexible substrate is located between the backing material and the piezoelectric transducer, with a wiring pattern provided on the face on the piezoelectric transducer side. In addition, the flexible substrate is folded in a direction substantially opposite the radiation direction around an end of the backing material widthwise. Moreover, the wiring pattern of the flexible substrate is covered by a covering member. In addition, the front face of the layer located on the front face side with regard to the wiring pattern has a width substantially equal to said first width and the back face of this layer is formed to have a second width shorter than said first width. Furthermore, a space is provided between this layer and the backing material due to the difference between the first width and the second width of this layer. Additionally, the covering member covers the wiring pattern extending at least from the folded section of the flexible substrate into the space.

The ultrasound transducer, its manufacturing method and the ultrasound probe according to the embodiment will hereinafter be described with reference to FIG. 1-FIG. 8.

First Embodiment

Schematic Configuration of the Ultrasound Probe

Figure 1:
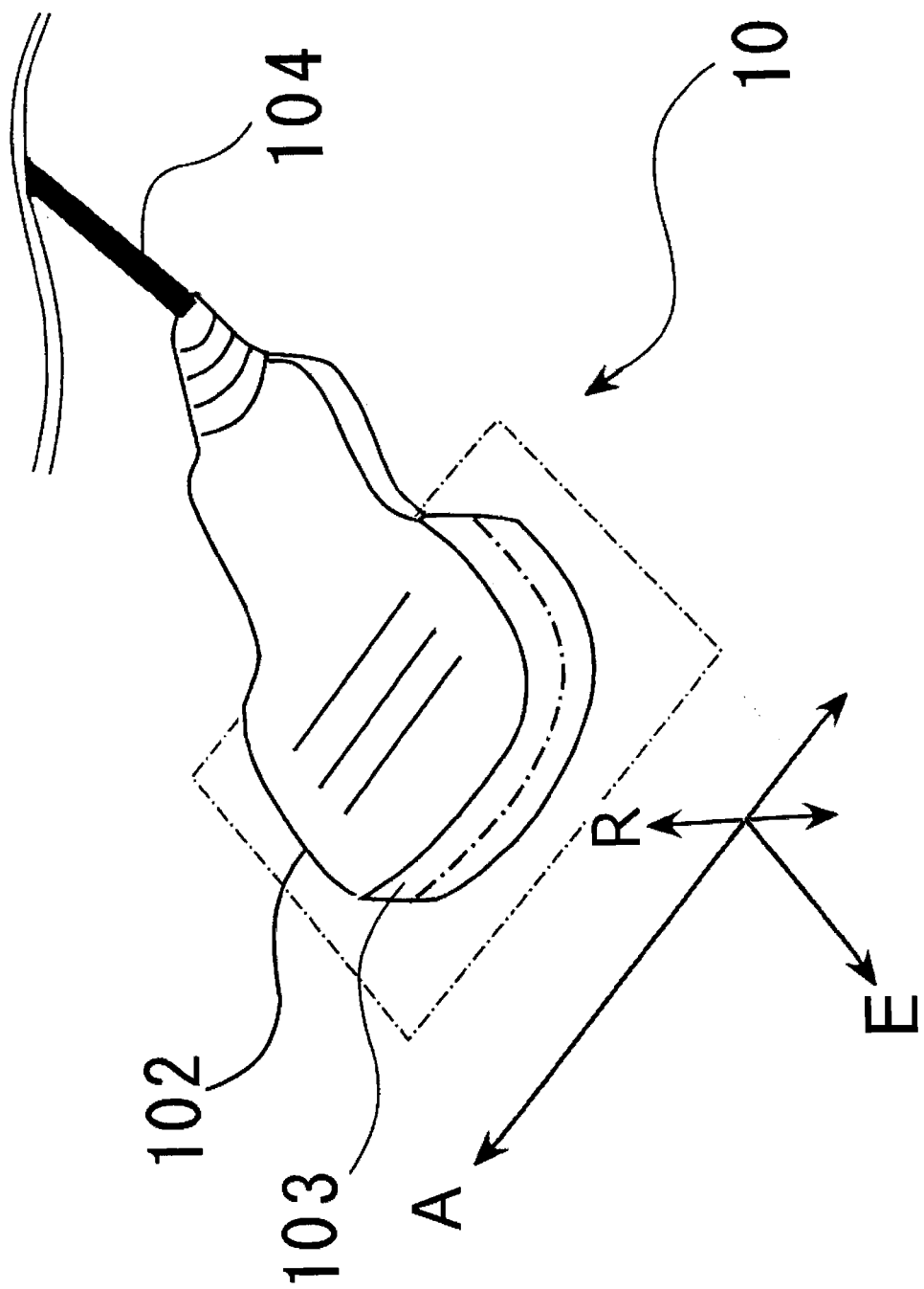
FIG. 1 is a schematic perspective view illustrating an ultrasound probe according to the embodiment.
Figure 2:
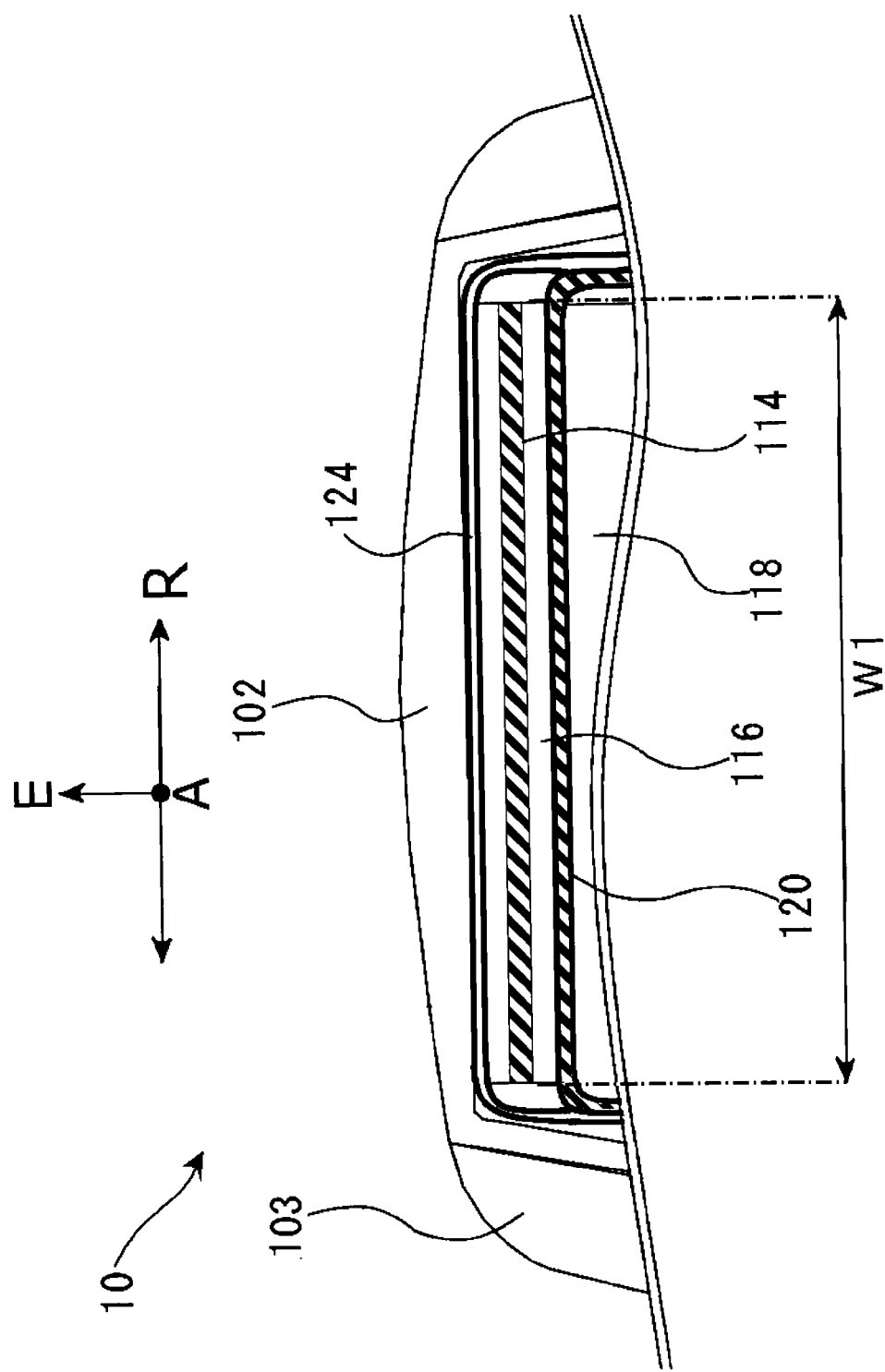
FIG. 2 is a schematic view of the ultrasound probe in the cross-section shown in FIG. 1.
Figure 3:
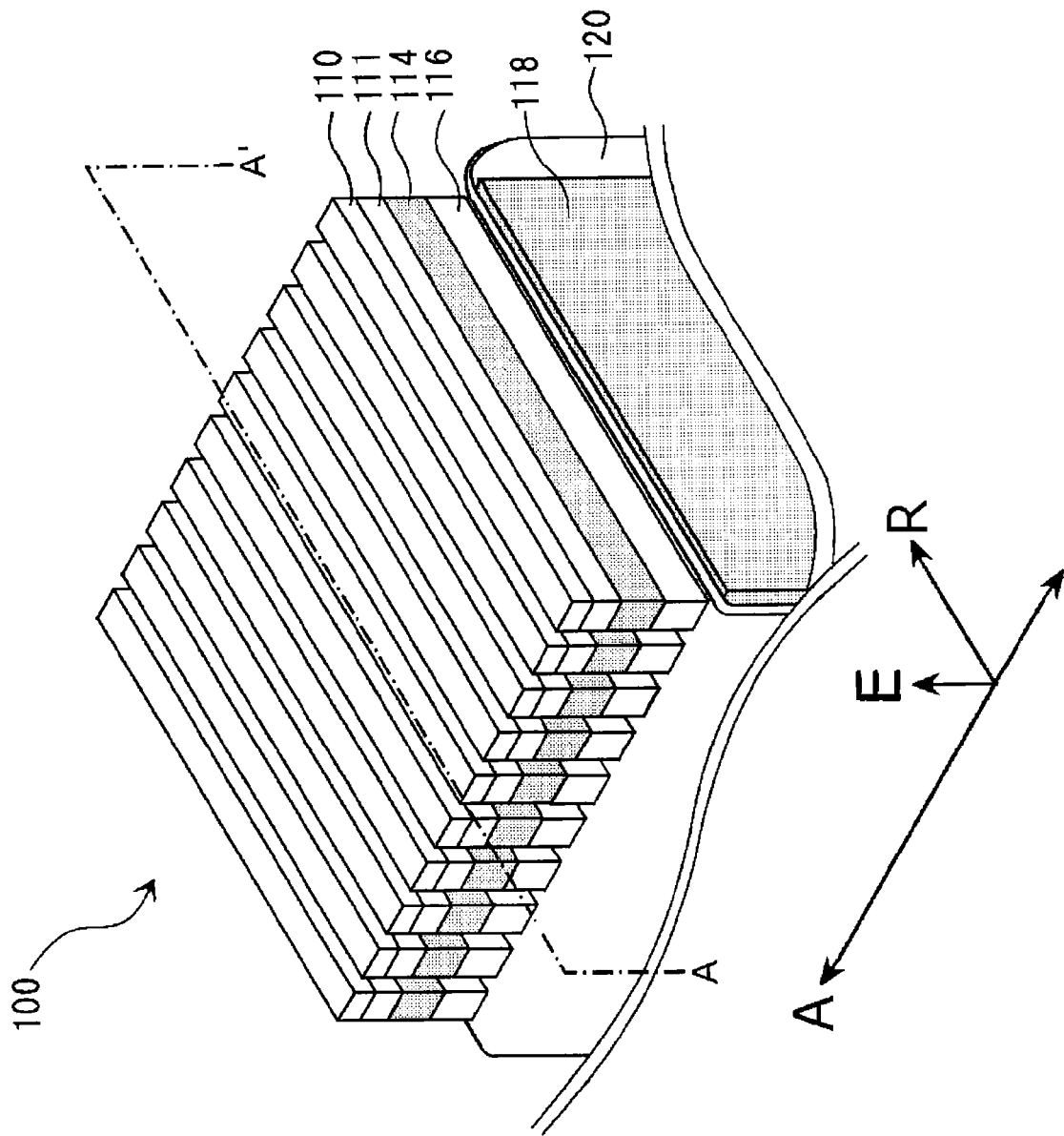
FIG. 3 is a schematic perspective view illustrating the ultrasound transducer of the ultrasound probe according to the first embodiment.

The ultrasound probe 10 and the ultrasound transducer 100 according to the first embodiment will be schematically described with reference to FIG. 1-FIG. 5. FIG. 1 is a schematic perspective view illustrating the ultrasound probe 10 according to the embodiment. FIG. 2 is a schematic view of the ultrasound probe 10 in the cross-section shown in FIG. 1. FIG. 3 is a schematic perspective view schematically illustrating the ultrasound transducer 100 according to the first embodiment.

Here, the ultrasound probe 10 shown in FIG. 1 is one example, but may be an ultrasound probe of another type. In addition, in FIG. 2, a drawing of the detailed configuration of the ultrasound transducer 100 is omitted. The shape of the overall element alignment of the ultrasound transducer 100 and the number of alignments of piezoelectric bodies 114 shown in FIG. 3 are also exemplary only. That is, a configuration other than the example shown in FIG. 3 may be applied. Moreover, in FIG. 3, drawings of the space between an intermediate layer 116 and a back face substrate 120, a wiring pattern 121, and an adhesive 128 used for adhesion of the intermediate layer 116 and the back face substrate 120 are omitted.

Additionally, in the following description, the direction from a backing material 118 to a first acoustic matching layer 110 is referred to as the "forward" direction. Moreover, the direction opposite the forward direction is referred to as the "backward" direction. Furthermore, the face facing the forward direction of each component in the ultrasound transducer 100 (the piezoelectric transducer 114, the intermediate layer 116, the backing material 118, the back face substrate 120, etc.) is referred to as the "front face." In addition, the face facing the backward direction is referred to as the "back face."

A schematic configuration of the ultrasound probe 10 and the ultrasound transducer 100 according to the first embodiment will hereinafter be described. As shown FIG. 1, the ultrasound probe 10 is configured to include a probe case 103 supporting an acoustic lens 102 that is a subject contact surface. In addition, the ultrasound probe 10 is configured to include a cable 104 connected to the opposite side of the acoustic lens 102 in the probe case 103. Also, within the ultrasound probe 10, as shown in FIG. 2, the ultrasound transducer 100 is provided having, for example, the piezoelectric transducer 114.

The ultrasound transducer 100 of this embodiment exemplified in FIG. 3 is configured to include the first acoustic matching layer 110, a second acoustic matching layer 111, the piezoelectric transducer 114, the intermediate layer 116, the backing material 118, the back face substrate 120, a front face substrate 124, etc. Additionally, in the example of FIG. 3, the piezoelectric transducer 114 is aligned in one dimension. Moreover, the second acoustic matching layer 111 is provided on the front face side of each piezoelectric transducer 114. Furthermore, the first acoustic matching layer 110 is provided on the front face side of the second acoustic matching layer 111. In addition, on the back face side of the piezoelectric transducer 114, in the backward direction, the intermediate layer 116 and the backing material 118 are provided in this order. Moreover, the back face substrate 120 is provided between the backing material 118 and the intermediate layer 116 of the piezoelectric transducer 114. Here, in the ultrasound transducer 100, the back face substrate 120 is at least drawn to the subsequent circuit such as a transmitting/receiving circuit. However, in FIG. 3, a drawing of the back face substrate 120 is partially omitted.

Additionally, as shown in FIG. 2, the front face substrate 124 is provided on the front face side of the first acoustic matching layer 110. Further, the acoustic lens 102 is provided on the front face side of the front face substrate 124. As with the back face substrate 120, the front face substrate 124 in FIG. 2 is omitted in the portion extending to the subsequent circuit. Moreover, a front face electrode is provided on the front face of the piezoelectric transducer 114, where the front face electrode is adjacent to the back face of the second acoustic matching layer 111. Furthermore, a back face electrode is provided on the back face of the piezoelectric transducer 114. The back face electrode is adjacent to the front face of the intermediate layer 116. Hereinafter, each of the components comprising the ultrasound transducer 100 will be respectively described.

<Piezoelectric Transducer>

The piezoelectric transducer 114 converts the voltage applied to the back face electrode and the front face electrode into ultrasound pulses. These ultrasound pulses are transferred to the subject. In addition, the piezoelectric transducer 114 receives the reflected waves from the subject and converts them into a voltage. As a material for the piezoelectric transducer 114, in general, PZT (lead zirconate titanate/Pb (Zr,Ti) O3), barium titanate (BaTiO3), PZNT (Pb (Zn⅓Nb⅔) O3-PbTiO3) single crystal, or PMNT (Pb (Mg⅓Nb⅔)

Figure 4:
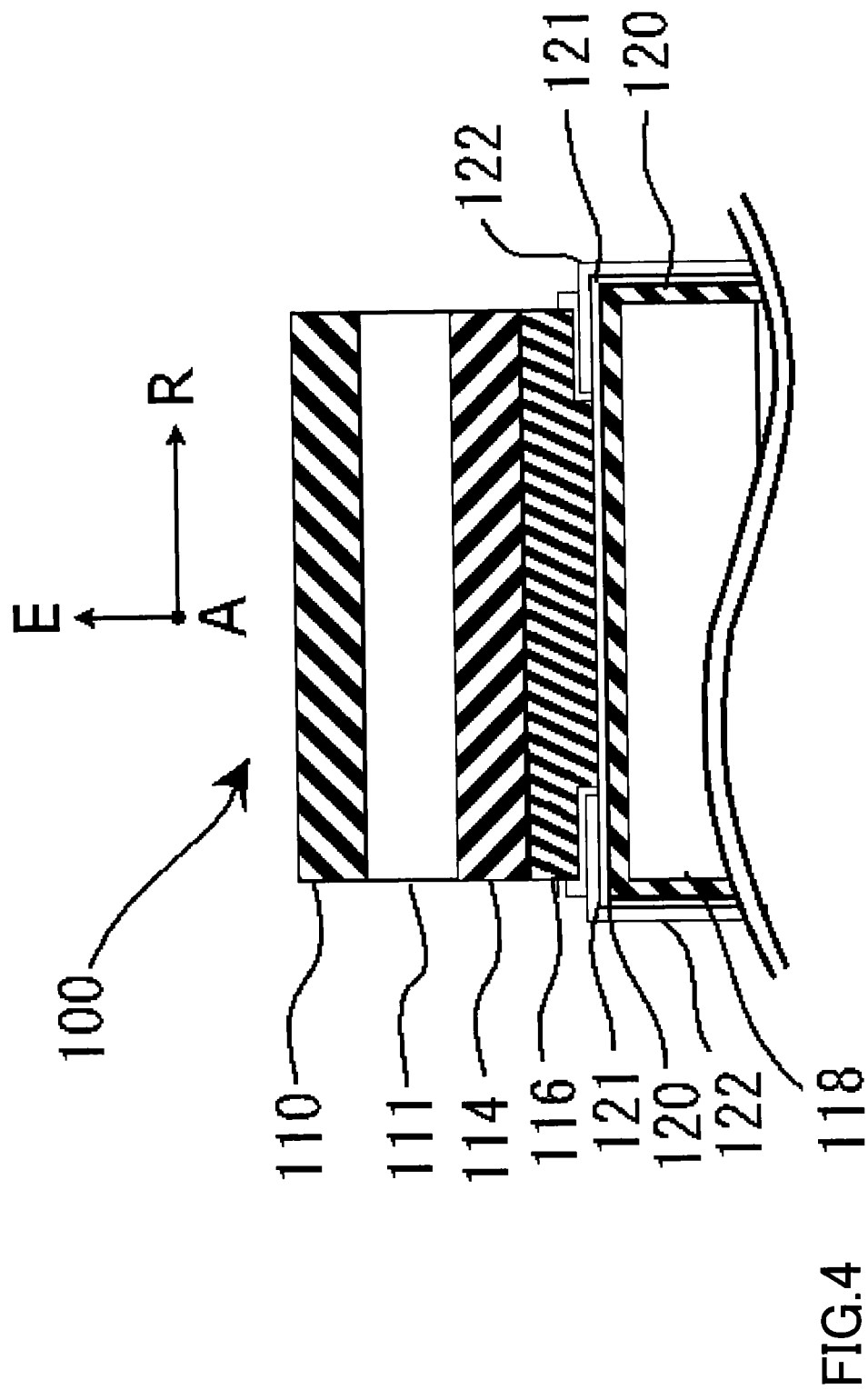
FIG. 4 is a schematic view illustrating the ultrasound transducer along A-A' in FIG. 3.

O3-PbTiO3) single crystal, etc., can be used. The acoustic impedance of the piezoelectric transducer 114 may be made to, for example, about 30 Mrayl. Moreover, by making the thickness of the piezoelectric transducer 114 into the thickness of $\lambda/4$ of a wavelength of the ultrasound waves, it is possible to be less susceptible to the influence on the back face side. While the piezoelectric transducer 114 shown in FIGS. 2-4 is configured as a single layer, this is one example and a piezoelectric transducer 114 with multiple layers can also be configured.

<Acoustic Matching Layer>

The first acoustic matching layer 110 and the second acoustic matching layer 111 are for matching the acoustic impedance between the piezoelectric transducer 114 and the subject. To this end, the first acoustic matching layer 110 and the second acoustic matching layer 111 are placed between the piezoelectric transducer 114 and the front face substrate 124 (see FIG. 3). For the first acoustic matching layer 110 and the second acoustic matching layer 111, materials of different acoustic impedance are used. For example, the impedance of the first acoustic matching layer 110 is about 4-7 Mrayl. The impedance of the second acoustic matching layer 111 is, for example, about 9-15 Mrayl. Such a configuration allows the acoustic impedance to be changed stepwise between the piezoelectric transducer 114 and the acoustic lens 102, and allows acoustic matching with the subject to be achieved. Moreover, the first acoustic matching layer 110 and the second acoustic matching layer 111 are made of a material with electric conductivity in order to provide a conductive connection between the front face electrode of the piezoelectric transducer 114 and the front face substrate 124. Alternatively, a conduction path is formed between at least either of the first acoustic matching layers 110 and the second acoustic matching layer 111.

As one example of the material for the first acoustic matching layer 110 having such a condition, for example, carbon (isotropic graphite or graphite) can be used. In addition, as an example of the second acoustic matching layer 111, machinable glass, machinable ceramics, a mixture of epoxy and metal oxide powder, a mixture of epoxy and metal powder, etc. can be used. Moreover, the thickness of the second acoustic matching layer 111 (the length in the forward-backward direction) is, for example, 150 μm-200 μm.

<Front Face Substrate>

The front face substrate 124 is, for example, an FPC (Flexible Printed Circuits) or an electric-conductive sheet, and each has a length extending to the subsequent circuit such as a transmitting/receiving circuit. In addition, a wiring pattern (connection lead/not shown) to be connected to, for example, the subsequent circuit is provided at least on the back face side of the front face substrate 124. In the example of FIG. 2 illustrating the ultrasound probe 10, the front face substrate 124 is placed between the first acoustic matching layer 110 and the acoustic lens 102. Moreover, the wiring pattern on the front face substrate 124 is conductively connected to the front face of the piezoelectric transducer 114 through the first acoustic matching layer 110 and the second acoustic matching layer 111. For example, the conduction path provided to the first acoustic matching layer 110 or the second acoustic matching layer 111 is electrically connected to the front face electrode through the first acoustic matching layer 110 or the second acoustic matching layer 111 itself having electric conductivity.

<Backing Material>

When the ultrasound pulses are sent, the backing material 118 absorbs the ultrasound pulses reflected in the direction (backward) opposite the radiation direction of the ultrasound waves and suppresses excess oscillation of each piezoelectric transducer 114. The reflection from the back face of each piezoelectric transducer 114 during oscillation is suppressed by the backing material 118. Consequently, it is possible to prevent the transmission/reception of the ultrasound pulses from being adversely affected. As the backing material 118, any material may be used in terms of the acoustic attenuation, acoustic impedance, etc. For example, epoxy resin or polyvinyl chloride including PUT powder or tungsten powder, rubber filled with ferrite powder, or porous ceramics immersed with epoxy resin or the like may be used. The acoustic impedance of the backing material 118 may be made to, for example, approximately 2 Mrayl-7 Mrayl.

Next, a description will be provided regarding the width (see W1 in FIG. 2) of the backing material 118 of the present embodiment in the lens direction (see R direction in FIGS. 1-4). The width W1 in the lens direction herein refers to the length of the backing material 118 perpendicular to the radiation direction of the ultrasound waves (see the direction E in FIGS. 1-4) and the alignment direction of the piezoelectric transducer 114 (see array direction; the direction A in FIGS. 1-4). However, this length may hereinafter be described as simply the "width in the lens direction" or "width." The width W1 of the backing material 118 in the lens direction is determined corresponding to the width of the piezoelectric transducer 114 and the intermediate layer 116 and the like in the same direction. For example, as shown in FIG. 2, the width W1 of the backing material 118 in the lens direction is approximately equal to the width of the piezoelectric transducer 114, etc., in the same direction. Here, the fact that the width W1 is substantially equal to the width of the piezoelectric transducer 114 in the lens direction means that, for the case in which the subject contact portion of the ultrasound probe 10 is affected by the width W1, the subject contact portion substantially does not become larger due to the width W1 of the backing material 118. In this context, the width W1 may be slightly narrower or broader than the width of the piezoelectric transducer 114.

The length of the subject contact portion (subject contact surface) of the ultrasound probe 10 may be affected by the structure of the ultrasound transducer 100 within the portion. For example, as shown in FIG. 2, the back face substrate 120 is folded back towards the subsequent circuit at the end of the backing material 118 widthwise. Accordingly, the space for placing the back face substrate 120 thus folded back at the end affects the width in the lens direction. In addition, in the example shown in FIG. 2, as the front face substrate 124 is also folded backward at the end of the first acoustic matching layer 110 widthwise, the space for placing the front face substrate 124 also affects the width in the lens direction. Moreover, the side of the acoustic lens 102 is placed within the probe case 103 on the forward side of the ultrasound probe 10, and furthermore, the face substrate 120 and the front face substrate 124 folded back as described above are placed within the lens. Therefore, the width of the ultrasound probe 10 in the lens direction (slice direction) is increased or decreased in proportion to each of the width of the backing material 118 (or the first acoustic matching layer 110), the width of the space for placing each folded substrate (120, 124), the width of the side of the acoustic lens 102, and the width of the probe case 103.

In this regard, as described above, the width W1 of the backing material 118 of the present embodiment in the lens direction is determined corresponding to the width of the piezoelectric transducer 114, etc. Consequently, it is possible to prevent the subject contact portion of the ultrasound probe 10 from becoming larger. In the present embodiment, in order to make the width W1 of the backing material 118 in the lens direction correspond to the piezoelectric transducer 114, etc., a step is provided on the back face of the intermediate layer 116. That is, a step is provided for housing a coverlay 122 between the back face of the intermediate layer 116 and the back face substrate 120. Its configuration will be described below.

<Intermediate Layer, Back Face Substrate>

Figure 5:
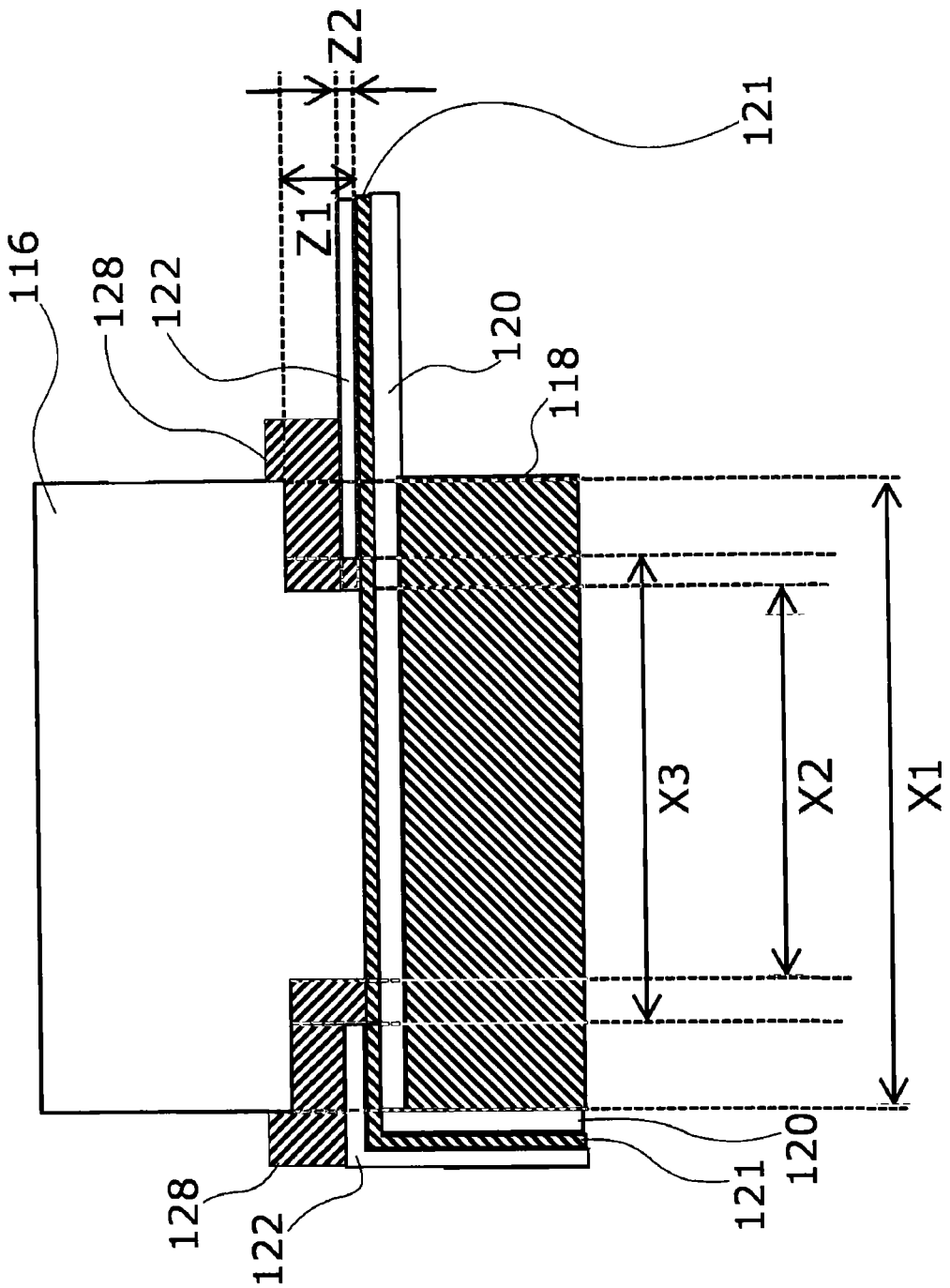
FIG. 5 is a schematic view illustrating the manufacturing process of the ultrasound transducer.

Next, the intermediate layer 116 and the back face substrate 120 of the ultrasound transducer 100 will be described with reference to FIGS. 1-5. FIG. 4 is a schematic view along A-A' in FIG. 3. FIG. 5 is a schematic view illustrating the manufacturing process of the ultrasound transducer 100. Note that the forward structure (piezoelectric transducer 114, etc.) relative to the intermediate layer 116 is omitted in FIG. 5. In addition, in FIG. 5, in order to explain the space portion, said space portion is emphasized and the ratio of the thickness relative to the overall thickness is shown as having increased. However, the height of the space and the thickness of the adhesive 128 are formed to be less than or equal to the thickness of the back face substrate 120 and the wiring pattern 121.

As shown in FIG. 4, the intermediate layer 116 is provided adjacent to the back face of the piezoelectric transducer 114 and in contact with a back face electrode of the piezoelectric transducer 114. Additionally, the intermediate layer 116 is configured to have higher acoustic impedance than that of the piezoelectric transducer 114 and the backing material 118. Furthermore, its thickness (i.e., its length in the radiation direction E of the ultrasound waves) may be substantially ¼ the wavelength of the ultrasound waves irradiated from the ultrasound transducer 100. Moreover, as a material for the intermediate layer 116, gold, lead, tungsten, mercury, sapphire, etc. may be used. With such an intermediate layer 116, it is possible to reflect the ultrasound waves irradiated to the back face side of the piezoelectric transducer 114 towards the front face side (acoustic lens 102 side) in order to enhance the acoustic characteristics.

Additionally, the front face substrate 120 is, for example, the FPC and each has a length extending to a subsequent circuit such as a transmitting/receiving circuit. Moreover, as shown in FIG. 4 and FIG. 5, a wiring pattern 121 is provided on at least the front face side of the back face substrate 120. The wiring pattern 121 on the back face substrate 120 is conductively connected to a back face electrode of the piezoelectric transducer 114 via the intermediate layer 116. For example, the wiring pattern 121 and the back face electrode are electrically connected through a conduction path provided penetrating the surface or the inside of the intermediate layer 116. Alternatively, by using the intermediate layer 116 with electric conductivity, the wiring pattern 121 and the back face electrode may be electrically connected through the intermediate layer 116 itself. Moreover, the wiring pattern 121 on the back face substrate 120 is connected to a subsequent circuit such as a transmitting/receiving circuit.

In addition, regarding the back face substrate 120, when the thickness of the substrate (base) portion is, for example, 20-50 µm, the thickness of the electrode and the wiring pattern 121 can be 10-20 µm. Furthermore, the thickness of the coverlay 122 may be 20-50 µm.

The configuration of the back face of the intermediate layer 116 and the configuration of the front face of the back face substrate 120 will now be described in detail. As shown in FIG. 5, the center of the back face of the intermediate layer 116 is formed in a convex shape protruding backward. That is, a cutout is provided with the intermediate layer 116 on the back face side (the surface adjacent to the back face substrate 120) from both sides of the intermediate layer 116 towards the centerline of the intermediate layer 116 along the forward-backward direction of the ultrasound transducer 100. In other words, the intermediate layer 116 is formed to have a first width X1 (see FIG. 5) substantially equal to the width of the piezoelectric transducer 114 on its front face (surface adjacent to the piezoelectric transducer 114), and also formed to have a second width X2 (see FIG. 5) shorter than the first width X1 on its back face side. Thereby, a step is formed on the back face of the intermediate layer 116 due to the difference between the first width X1 on the forward side and the second width X2 on the back side. This step has an end surface protruding backwards on the center side of the back face or the intermediate layer 116, and is also located on the forward side from this end surface. The step also has an opposing surface facing the back face substrate 120 at a predetermined interval.

In addition, as shown in FIG. 5, at least a portion of the wiring pattern 121 on the front face of the back face substrate 120 is covered with the coverlay (film, covering material) 122 made of, for example, a polyimide film. As the back face substrate 120 is folded back to the subsequent circuit side, a breakage (such as disconnection) of the wiring pattern 121 may occur at the folded section. In order to prevent this, the wiring pattern 121 is covered with the coverlay 122. For example, in the manufacturing process of the ultrasound transducer 100, the intermediate layer 116 and the back face substrate 120 may be adhered (see the right side of FIG. 5) before folding the back face substrate 120 (see the left side of FIG. 5). In this case, as the coverlay 122 is protecting the wiring pattern 121, it is possible to avoid the situation in which a breakage occurs in the wiring pattern 121 by such a process. Note that the coverlay 122 corresponds to an example of the "covering member."

Because the back face substrate 120 is folded at the end of the backing material 118 widthwise, the coverlay 122 covers the folded section for protecting the wiring pattern 121. Moreover, the coverlay 122 covers the portion between a pair of folded sections of the back face substrate 120, i.e., the portion parallel to the front face of the backing material 118. This is for the purpose of ensuring the protection of the folded section corresponding to the end or the backing material 118 widthwise by using the coverlay. However, the coverlay 122 is not provided in the area at which the wiring pattern 121 is in direct contact with the intermediate layer 116. That is, the coverlay 122 is provided so as to sandwich the surface where the wiring pattern 121 is in direct contact with the intermediate layer 116 (FIG. 5) in the portion of the wiring pattern 121 parallel to the front face of the backing material 118. In other words, the coverlay 122 covers the area from the covering point on the folded section of the wiring pattern 121 to the point before reaching the end surface of the intermediate layer 116 on the back side.

In addition, as shown FIG. 5, the height of the step Z1 on the back face of the intermediate layer 116 is formed so as to be able to accommodate the thickness Z2 of the coverlay 122 (Z1>Z2). Note that the height of the step refers to the length from the abovementioned end surface of the back face of the intermediate layer 116 to the opposing surface. Consequently, there is a predetermined interval Z1 between the abovementioned opposing surface of the back face of the intermediate layer 116 and the front face of the back face substrate 120. A portion of the coverlay 122 covering the wiring pattern 121 is housed in this space created between the step (opposing surface) of the intermediate layer 116 and the back face substrate 120.

Such an interval Z1 may be, for example, approximately 25-55 µm when the thickness Z2 of the coverlay 122 is 20-50

μm. As in this example, the above-mentioned interval Z1 that is the height of the space is determined so as not to interfere with the process of adhering the intermediate layer 116, the back face substrate 120 and the backing material 118. That is, the height of the step on the intermediate layer 116 (interval Z1) is substantially slightly higher than the thickness of the coverlay 122. This makes it possible to avoid the risk of interfering with the process of pressurized adhesion of the intermediate layer 116, the back face substrate 120 and the backing material 118.

In addition, as described above, the coverlay 122 covers not only the folded section of the wiring pattern 121 but also the portion of the area in the wiring pattern 121 parallel to the front face of the backing material 118 from one folded section to the other folded section. As shown in FIG. 5, as a space is formed between the intermediate layer 116 and the back face substrate 120 in the embodiment, the coverlay 122 does not interfere with the side of the intermediate layer 116 and is housed within the space. That is, the coverlay 122 extends by a predetermined length from one end of the backing material 118 widthwise to the other end on the opposite side, and the above-mentioned space is longer than at least the extended length in the extending direction.

In such an embodiment, a step is provided to the intermediate layer 116 to create a space for housing the coverlay 122 extending from one end to the other of the backing material 118 between the front face of the back face substrate 120. With such a structure, a space for placing the coverlay 122 on the front face of the backing material 118 can be ensured without making the width of the backing material 118 larger than the width of the piezoelectric transducer 114 or the intermediate layer 116. Consequently, the width of the backing material 118 makes it possible to avoid the situation in which the subject contact portion of the ultrasound probe 10 is made larger. As a result, even when, for example, scanning is carried out with which the subject contact portion of the ultrasound probe is placed between ribs, it is possible to reduce the overlapping area of the ribs in the chest and the subject contact portion. Once said overlapping area has been reduced, placement of the subject contact portion between the ribs becomes easier, making it possible to avoid the risk of interfering with the creation of ultrasound images.

Moreover, the intermediate layer 116 is bonded to the back face substrate 120 using an adhesive 128. This adhesive 128 is in contact with the step consisting of the above-mentioned end surface and the opposing surface of the intermediate layer 116. Furthermore, the adhesive 128 is in contact with the space for housing the coverlay 122. In addition, the adhesive 128 is provided on the folded section of the back face substrate 120. Therefore, the adhesive 128 provided, as shown in FIG. 5, so as to be in contact with the opposing surface of the intermediate layer 116, the side of the projecting portion, the wiring pattern 121 on the front face of the back face substrate 120, and the coverlay 122. In this way, the intermediate layer 116 is bonded to the back face substrate 120.

While in the above description the end surface of the projection of the intermediate layer 116 is in direct contact with the wiring pattern 121, the present embodiment is not limited to such a configuration. For example, the end surface may be connected to the wiring pattern 121 via an adhesive layer with electric conductivity. However, as in the abovementioned embodiment, by putting the end surface of the intermediate layer 116 in direct contact with the wiring pattern 121, the acoustic characteristics and connection reliability between the intermediate layer 116 and the front face electrode may be improved.

(Outline of the Manufacturing Method of the Ultrasound Transducer)

Next, with reference to FIG. 1-FIG. 5, a part of the manufacturing method of the ultrasound transducer 100 according to the first embodiment, i.e., the process involving connection of the intermediate layer 116, the back face substrate 120 and the backing material 118 will be described.

<<Intermediate Layer>>

In one example of the present embodiment shown in FIG. 5, the intermediate layer 116 of the ultrasound transducer 100 is formed such that the back face side is in a convex shape as described above. The step on the intermediate layer 116 is formed by any method such as cutting, molding, etc.

<<Back Face Substrate>>

The wiring pattern 121 provided on the back face substrate 120 is covered by the coverlay 122. This coverlay 122 covers the folded section of the wiring pattern 121. Moreover, the coverlay 122 covers a portion of the wiring pattern 121 provided from this folded section towards the other folded section. However, the coverlay 122 is not provided in the area at which the wiring pattern 121 is in contact with the end surface of the intermediate layer 116. That is, as shown in FIG. 5, in the area where the wiring pattern 121 is placed parallel to the backing material 118, the area excluding the area in contact with the end surface of the intermediate layer 116 and its surrounding area (see area X3 in FIG. 5) is covered by the coverlay 122.

<<Connection Between the Back Face Substrate and the Intermediate Layer 116>>

As shown in FIG. 5, the back face substrate 120 provided on the front face of the backing material 118 and the intermediate layer 116 formed in a convex shape are connected as follows. First, the back face substrate 120 and the intermediate layer 116 are made to face each other at a predetermined interval. Moreover, the adhesive 128 is provided in the space between the back face substrate 120 and the intermediate layer 116, i.e., on both ends in the lens direction. After the adhesive 128 is provided to both ends, for example, pressurized adhesion is carried out. Consequently, the adhesive 128 enters the space between the back face substrate 120 and the intermediate layer 116. The intermediate layer 116 is adhered to the back face substrate 120 with this adhesive 128. At this point, as shown on the right side of FIG. 5, the back face substrate 120 is in a state of not being folded.

<<Folding of the Back Face Substrate>>

As described hereinabove, the adhesive 128 is provided on both of the abovementioned ends (space) and the adhesion process is carried out. After the adhesion process, as shown on the right side of FIG. 5, the back face substrate 120 is folded at both ends of the backing material 118. As the folded section of the wiring pattern 121 is covered by the coverlay 122, the risk of breakage during the folding process is reduced.

(Connection Between the Ultrasound Transducer and External Devices)

Next, one exemplary configuration will be described regarding the connection between the ultrasound probe having the ultrasound transducer 100 of the first embodiment and the main body of the ultrasound imaging apparatus. Note that the drawing is omitted in the following description. The ultrasound transducer 100 is provided within the ultrasound probe. In addition, the ultrasound probe has an interface (such as a cable) for electrically connecting the main body of the ultrasound imaging apparatus and the ultrasound probe. The ultrasound transducer 100 is also electrically connected to the main body of the ultrasound imaging apparatus through the wiring pattern on the front face substrate 124 and the wiring pattern on the back face substrate 120 as well as the interface on the ultrasound probe. That is, the main body and the ultrasound probe communicate a signal regarding the transmission/reception of the ultrasound waves between each other.

Within the ultrasound probe, a circuit substrate on which an electrical circuit such as a transmitting/receiving circuit is provided or a connection substrate for connecting the interface to the electronic circuit may be provided. In this case, signals are transmitted or received between the front face electrode or the back face electrode and the main body of the ultrasound imaging apparatus via the interface connecting the ultrasound probe to the main body, the wiring pattern of the connection substrate, the electronic circuit, or the wiring pattern on the front face substrate 124 or the back face substrate 120.

For example, the main body of the ultrasound imaging apparatus sends an electric signal regarding the operational control of the ultrasound transducer 100 from its control unit to the ultrasound probe via the interface. This electric signal is sent to the electronic circuit in the circuit substrate via the connection substrate. The electronic circuit applies, based on the signal from the control unit in the main body of the ultrasound imaging apparatus, a voltage on the piezoelectric transducer 114 through the front face substrate 124 or the back face substrate 120. In this way, the ultrasound pulses are sent to the subject.

Moreover, the ultrasound transducer 100, for example, upon receiving the reflected waves from the subject, sends an electric signal, which has been converted by the piezoelectric transducer 114, to the electronic circuit via, for example, the back face substrate 120. The electronic circuit carries out a predetermined processing (delayed summation, amplification, etc.) on this electric signal and also sends the electric signal to the control unit in the main body of the ultrasound imaging apparatus via the connection circuit or the interface. On the basis of this electric signal, the ultrasound imaging apparatus creates an ultrasound image. Note that the configuration may be such that the ultrasound probe is not provided with the electronic circuit.

(Operation and Effect)

The operation and effect of the ultrasound transducer 100 and the ultrasound probe according to the first embodiment described above will be described.

In the ultrasound transducer 100 of the first embodiment, a step is provided to the intermediate layer 116. This creates, between the intermediate layer 116 and the back face substrate 120, a space cut out from the folded section of the back face substrate 120 toward the folded section of the other end. The coverlay 122 covering the wiring pattern 121 is housed in this space. Therefore, it is possible to ensure a space for placing the coverlay 122 without expanding the width of the backing material 118 in the lens direction.

With such a configuration, a space for placing the coverlay 122 on the front face of the backing material 118 can be ensured without making the width of the backing material 118 larger than the width of the piezoelectric transducer 114 or the intermediate layer 116. Consequently, the width of the backing material 118 makes it possible to avoid the situation in which the subject contact portion of the ultrasound probe 10 is made larger.

(First Variation)

Next, a first variation of the first embodiment will be described. In the ultrasound transducer 100 described above, the intermediate layer 116 is placed between the backing material 118 and the piezoelectric transducer 114. However, it may be configured such that the intermediate layer 116 is not provided in the ultrasound transducer 100. In such a case, the shape of the back face of the piezoelectric transducer 114 may be configured like the step of the above-mentioned intermediate layer 116. In this case, the back face electrode is provided on the end surface of the projection at the step of the piezoelectric transducer 114. Alternatively, the back face electrode may be provided on not only the end surface of the piezoelectric transducer 114 but also the opposing surface facing the back face substrate 120. Also in this case, a material with electric conductivity may be used for the adhesive 128. However, in terms of the impact on the acoustic characteristics, the configuration in which the intermediate layer 116 is provided as described above and a step is provided on the intermediate layer 116 may be more suitable.

(Second Variation)

Figure 6:
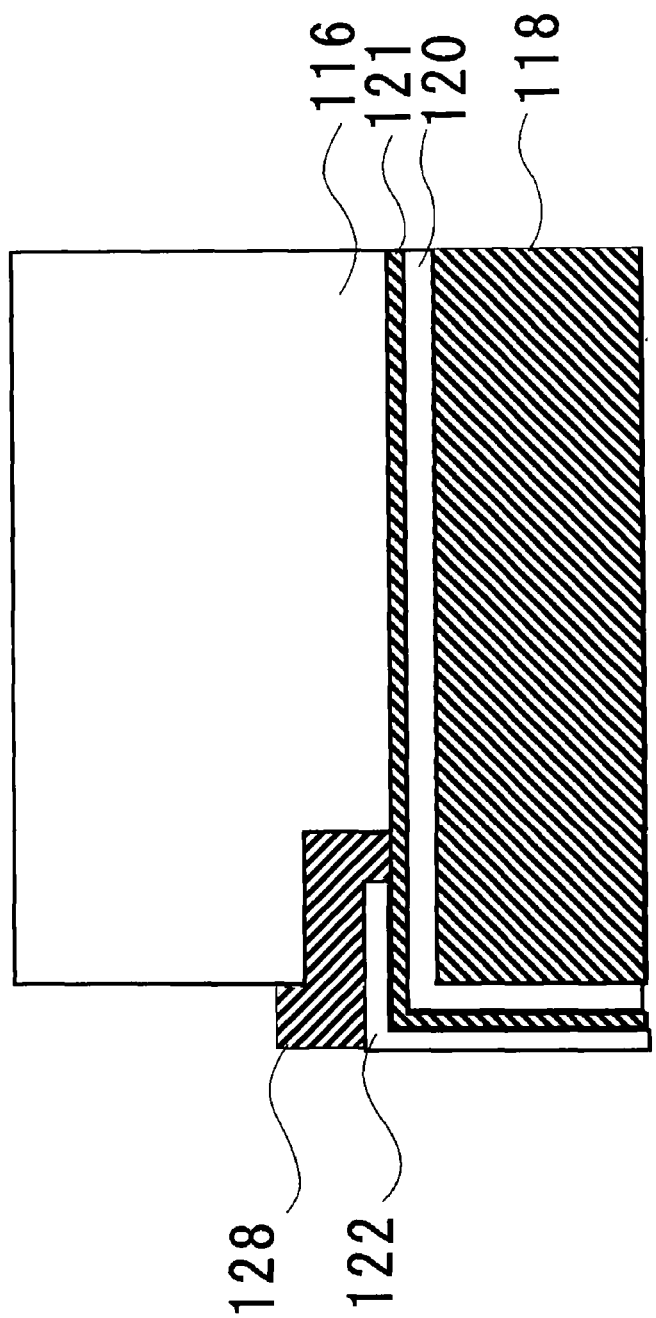
FIG. 6 is a schematic view illustrating the ultrasound transducer according to the first variation.

A second variation of the first embodiment will be described with reference to FIG. 6. FIG. 6 is a schematic view illustrating the ultrasound transducer 100 according to the first variation. A space is provided on both ends in the lens direction of the back face of the intermediate layer 116 in the abovementioned embodiment. However, without being limited to this, when the wiring pattern 121 is withdrawn from only one end of the backing material 118 in the lens direction, the back face substrate 120 is also folded at only one corresponding end as shown in FIG. 6. In this case, in the intermediate layer 116, it is sufficient to provide a step on only one side corresponding to the folded section of the back face substrate 120.

Second Embodiment

Figure 7:
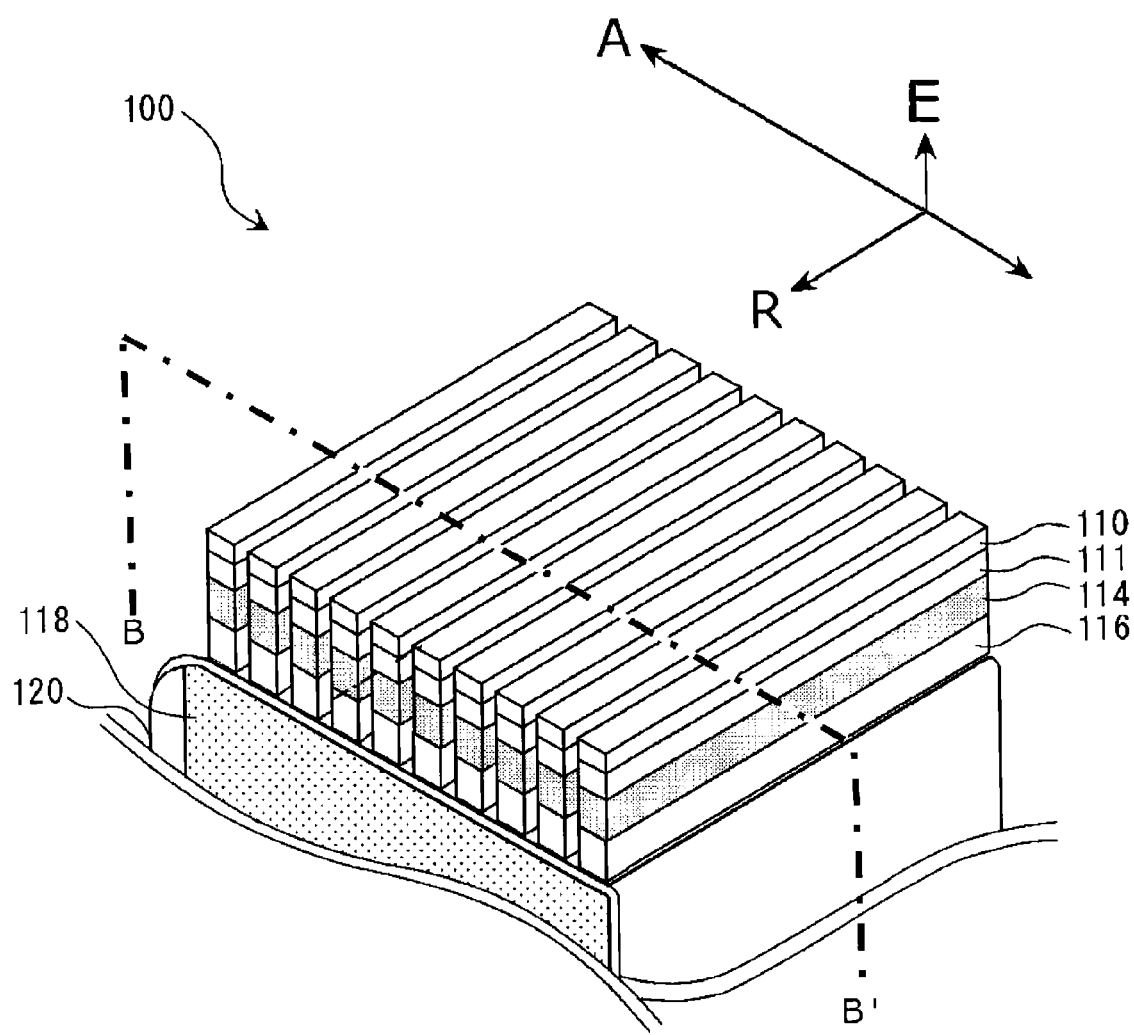
FIG. 7 is a schematic perspective view illustrating the ultrasound transducer of the ultrasound probe according to the second embodiment.

Next, the ultrasound transducer 100 and an ultrasound probe provided with the ultrasound transducer 100 according to the second embodiment will be described with reference to FIG. 7 and FIG. 8. FIG. 7 is a schematic perspective view illustrating the ultrasound transducer 100 of the ultrasound probe according to the second embodiment. In the second embodiment, the areas different from the first embodiment are mainly described and thus a description of the other overlapped areas is omitted. In addition, the number of elements of the ultrasound transducer 100 illustrated in FIG. 7 is not shown. The number of rows and the number of columns are also exemplary only, and another configuration may be applied.

(Schematic Configuration of the Ultrasound Transducer 100)

The ultrasound transducer 100 of this embodiment exemplified in FIG. 7 is, as in the first embodiment, configured to include a first acoustic matching layer 110, a second acoustic matching layer 111, a piezoelectric transducer 114, an intermediate layer 116, a backing material 118, a back face substrate 120, a front face substrate 124, etc. Additionally, in one example of the second embodiment shown in FIG. 7, the piezoelectric transducer 114 is aligned in one dimension. Moreover, its configuration is similar to that of the first embodiment, in which the intermediate layer 116, the piezoelectric transducer 114, the second acoustic matching layer 111, the first acoustic matching layer 110 and the acoustic lens 102 are placed in this order in the forward direction. Here, in the ultrasound transducer 100, the back face substrate 120 is at least drawn to the subsequent circuit such as a transmitting/receiving circuit. However, in FIG. 7, a drawing of the back face substrate 120 is partially omitted. Also in FIG. 7, a drawing of the adhesive 128 is omitted.

Also in the second embodiment, the back face substrate 120 is placed between the intermediate layer 116 and the backing material 118. However, as shown in FIG. 7, the back face substrate 120 in the second embodiment is folded towards the subsequent circuit side at both ends of the piezoelectric transducer 114 in the alignment direction (see the direction A in FIG. 7) rather than both ends of the backing material 118 in the lens direction. The alignment direction of the piezoelectric transducer 114 may hereinafter be referred to simply as the "array direction."

Figure 8:
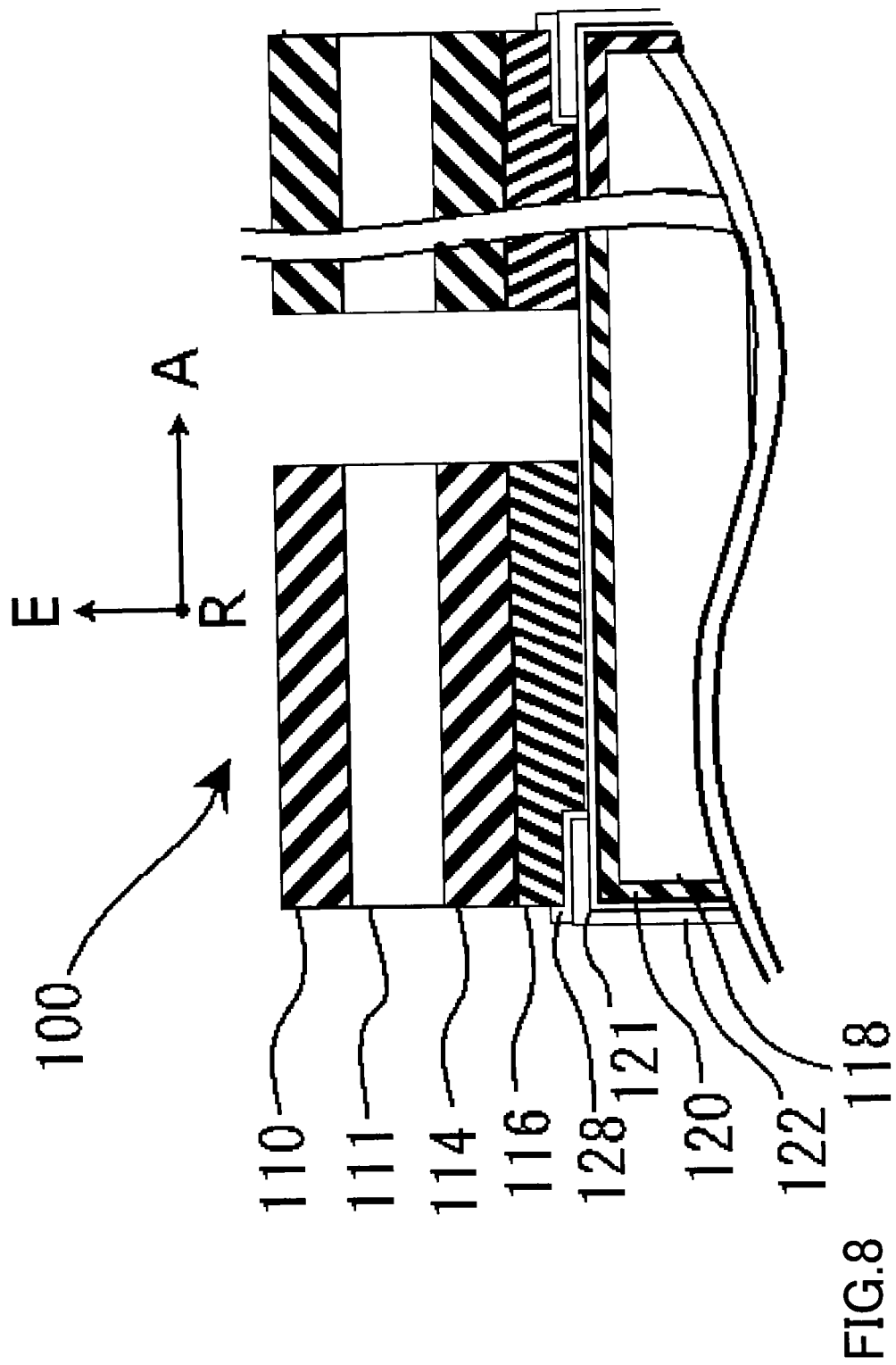
FIG. 8 is a schematic view illustrating the ultrasound transducer along B-B' of FIG. 7.

FIG. 8 is a schematic view illustrating the ultrasound transducer 100 along B-B' of FIG. 7. In FIG. 8, the elements shown on the left side are elements on one end of the element alignment. In addition, the elements shown on the right side in this figure are elements provided on the other end of the element alignment. As described above, the back face substrate 120 in the second embodiment is folded at both ends of the backing material 118 in the array direction. Therefore, the area of the wiring pattern 121 to be covered and protected by the coverlay 122 is the area corresponding to both of the above-mentioned ends.

Therefore, a step is provided on only the element on both ends of the alignment (intermediate layer 116). In addition, as shown in FIG. 8, in the back face of the element on both ends described above, the step is provided only on one side corresponding to the folded section of the wiring pattern 121, rather than on both sides.

(Operation and Effect)

The operation and effect of the ultrasound transducer 100 and the ultrasound probe according to the second embodiment described above will be described.

In the ultrasound transducer 100 of the second embodiment, a step is provided to the intermediate layer 116 on both ends of the element alignment. In addition, this step is provided only on the portion of the back face of the intermediate layer 116 in proximity to the folded section of the wiring pattern 121. With this step, a space is provided between the front face of the back face substrate 120 and the back face of the intermediate layer 116. The coverlay 122 covering the wiring pattern 121 is housed in this space. Therefore, it is possible to ensure a space for placing the coverlay 122 without expanding the width of the backing material 118 in the array direction.

With such a configuration, without making the width of the backing material 118 in the array direction larger than the length of the overall alignment of the piezoelectric transducer 114, a space for placing the coverlay 122 on the front face of the backing material 118 can be ensured. Consequently, the width of the backing material 118 makes it possible to avoid the situation in which the subject contact portion of the ultrasound probe 10 is made larger.

(Variation)

In the above description, the ultrasound probe 10 having the ultrasound transducer in a 1D array is described for both the first embodiment and the second embodiment. However, those embodiments can be applied to the ultrasound transducer in a 2D array.

Moreover, as shown in FIG. 3 and FIG. 7, although an example in which the element alignment is linear has been described for both the above first embodiment and the second embodiment, these embodiments can also be applied to an ultrasound probe comprising an ultrasound transducer with the element alignment in a convex shape or a curved shape.

Furthermore, in both the first embodiment and the second embodiment, a structure in which the folded section of the back face substrate 120 and the folded section of the front face substrate 124 are both consistent in the array direction or in the lens direction has been described. However, the configuration in which a space is provided between the back face substrate 120 by a step can also be applied to the configuration in which the substrate is folded at one end in the lens direction as well as folded at the other end in the array direction.

In the ultrasound probe according to the above-mentioned embodiments and its variations, a step is provided to create a space for housing the coverlay 122 extending from one end to the other end of the backing material 118 between the front face of the back face substrate 120. With such a structure, without making the width of the backing material 118 larger than the width of the piezoelectric transducer 114 or the intermediate layer 116, a space for placing the coverlay 122 on the front face of the backing material 118 can be ensured. Consequently, the width of the backing material 118 makes it possible to avoid the situation in which the subject contact portion of the ultrasound probe 10 is made larger. As a result, even when, for example, scanning with the subject contact portion of the ultrasound probe placed between the ribs, it is possible to reduce the overlapping area of the ribs in the chest and the subject contact portion. Once the overlapping area has been reduced, placement of the subject contact portion between ribs becomes easier, making it possible to avoid the risk of interfering with the creation of ultrasound images.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ultrasound probe comprising:
a piezoelectric transducer having a front face side facing a radiation direction of ultrasound waves and a back face side facing a direction that is opposite to the radiation direction of ultrasound waves;
a backing material provided on the back face side of said piezoelectric transducer, and having a first width substantially equal to a width of said piezoelectric transducer in widthwise direction perpendicular to said radiation direction;
a flexible substrate located between said backing material and said piezoelectric transducer, provided with a wiring pattern on a surface that is facing the piezoelectric transducer, and folded in a direction substantially opposite said radiation direction around an end of said backing material widthwise; and
a covering member that covers said wiring pattern, wherein:
a front face of a layer located on the front face side with regard to said wiring pattern has a width substantially equal to said first width, with a back face formed to have a second width shorter than said first width; and
said covering member covers said wiring pattern extending at least from a folded section of said flexible substrate to a space between said layer and said backing material due to a difference between said first width and said second width.

2. An ultrasound probe comprising:
a plurality of piezoelectric transducers each having a front face side facing a radiation direction of ultrasound waves and a back face side facing a direction that is opposite to the radiation direction of ultrasound waves, and aligned in a direction perpendicular to said radiation direction;
a backing material provided on the back face side of said plurality of piezoelectric transducers, and having a width substantially equal to a length of alignment of said plurality of piezoelectric transducers;

a flexible substrate located between said backing material and said plurality of piezoelectric transducers, provided with a wiring pattern on a surface that is facing the plurality of piezoelectric transducers, and folded in a direction substantially opposite said radiation direction around an end of said backing material in the alignment direction of said plurality of piezoelectric transducers; and a covering member for covering said wiring pattern, wherein:
  a cutout is provided on a back face section of a layer located on a front side with regard to said wiring pattern, the cutout being open outward; and
  said covering member covers said wiring pattern extending at least from a folded section of said flexible substrate to said cutout.

3. The ultrasound probe according to claim 1, wherein said layer is provided between said flexible substrate on said backing material and said piezoelectric transducer, and is an intermediate layer made of a material with higher acoustic impedance than said piezoelectric transducer.

4. The ultrasound probe according to claim 1, wherein said layer is said piezoelectric transducer.

5. The ultrasound probe according to claim 1, wherein said back face of said layer and said wiring pattern on said flexible substrate are in direct contact, and a side of said layer and said covering member are bonded with an adhesive.

6. The ultrasound probe according to claim 1, wherein an adhesive layer is situated between said wiring pattern and said layer.

7. A method of manufacturing an ultrasound probe, the ultrasound probe including a piezoelectric transducer that has a front face side facing a radiation direction of ultrasound waves and a back face side facing a direction that is opposite to the radiation direction of ultrasound waves, an intermediate layer made of a material with higher acoustic impedance than said piezoelectric transducer, a backing material having a first width substantially equal to a width of said piezoelectric transducer, a flexible substrate provided with a wiring pattern, and a covering member for covering said wiring pattern, the method comprising:
  forming a second width shorter than said first width in said intermediate layer;
  by connecting said backing material together with said flexible substrate to said intermediate layer, forming a space surrounded by a step formed by said first width and said second width in said intermediate layer and said flexible substrate, and placing an end of said covering member covering said wiring pattern within that space; and
  folding said flexible substrate.

8. A method of manufacturing an ultrasound probe, the ultrasound probe including a plurality of piezoelectric transducers each having a front face side facing a radiation direction of ultrasound waves and a back face side facing a direction that is opposite to the radiation direction of ultrasound waves, and aligned perpendicularly to said radiation direction, an intermediate layer made of a material with higher acoustic impedance than said plurality of piezoelectric transducers, a backing material having a width substantially equal to a length of alignment of said plurality of piezoelectric transducers, a flexible substrate provided with a wiring pattern, and a covering member for covering said wiring pattern, the method comprising:
  forming a step by providing a cutout on the back face side of said intermediate layer;
  by connecting said backing material together with said flexible substrate to said intermediate layer, forming a housing for said covering member surrounded by said step in said intermediate layer and said flexible substrate, and placing an end of said covering member covering said wiring pattern within that housing; and
  folding said flexible substrate.

9. The ultrasound probe according to claim 2, wherein said layer is provided between said flexible substrate on said backing material and the plurality of piezoelectric transducers, and is an intermediate layer made of a material with higher acoustic impedance than the plurality of piezoelectric transducers.

10. The ultrasound probe according to claim 2, wherein said layer is the plurality of piezoelectric transducers.

11. The ultrasound probe according to claim 2, wherein said back face of said layer and said wiring pattern on said flexible substrate are in direct contact, and a side of said layer and said covering member are bonded with an adhesive.

12. The ultrasound probe according to claim 2, wherein an adhesive layer is situated between said wiring pattern and said layer.

* * * * *